(12) United States Patent
Xie et al.

(10) Patent No.: US 10,113,234 B2
(45) Date of Patent: Oct. 30, 2018

(54) UV ASSISTED SILYLATION FOR POROUS LOW-K FILM SEALING

(71) Applicant: Applied Materials, Inc., Santa Clara, CA (US)

(72) Inventors: Bo Xie, San Jose, CA (US); Alexandros T. Demos, Fremont, CA (US); Vu Ngoc Tran Nguyen, Santa Clara, CA (US); Kelvin Chan, San Ramon, CA (US); He Ren, San Jose, CA (US); Kang Sub Yim, Palo Alto, CA (US); Mehul B. Naik, San Jose, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 215 days.

(21) Appl. No.: 14/801,348

(22) Filed: Jul. 16, 2015

(65) Prior Publication Data
US 2016/0017492 A1    Jan. 21, 2016

Related U.S. Application Data

(60) Provisional application No. 62/027,149, filed on Jul. 21, 2014.

(51) Int. Cl.
| | |
|---|---|
| *C23C 16/48* | (2006.01) |
| *C23C 16/40* | (2006.01) |
| *H01L 21/768* | (2006.01) |
| *H01L 21/3105* | (2006.01) |

(52) U.S. Cl.
CPC ......... *C23C 16/482* (2013.01); *C23C 16/401* (2013.01); *H01L 21/3105* (2013.01); *H01L 21/76825* (2013.01); *H01L 21/76829* (2013.01)

(58) Field of Classification Search
None
See application file for complete search history.

(56) References Cited

U.S. PATENT DOCUMENTS

| | | | | |
|---|---|---|---|---|
| 4,597,986 | A * | 7/1986 | Scapple | ............ C23C 16/45578 118/50.1 |
| 7,148,155 | B1 * | 12/2006 | Tarafdar | ............ H01L 21/02164 257/E21.279 |
| 8,216,861 | B1 * | 7/2012 | Yim | .................... H01L 21/3105 257/E21.471 |
| 8,877,659 | B2 | 11/2014 | Chan et al. | |
| 2010/0178468 | A1 * | 7/2010 | Jiang | .................. B01D 67/0002 428/164 |
| 2011/0159202 | A1 * | 6/2011 | Matsushita | ......... H01L 21/3105 427/509 |

(Continued)

*Primary Examiner* — Shamim Ahmed
*Assistant Examiner* — Bradford M Gates
(74) *Attorney, Agent, or Firm* — Patterson + Sheridan LLP

(57) ABSTRACT

Embodiments described herein provide a method for sealing a porous low-k dielectric film. The method includes forming a sealing layer on the porous low-k dielectric film using a cyclic process. The cyclic process includes repeating a sequence of depositing a sealing layer on the porous low-k dielectric film and treating the sealing layer until the sealing layer achieves a predetermined thickness. The treating of each intermediate sealing layer generates more reactive sites on the surface of each intermediate sealing layer, which improves the quality of the resulting sealing layer.

2 Claims, 2 Drawing Sheets

(56) References Cited

U.S. PATENT DOCUMENTS

2012/0270339 A1* 10/2012 Xie .................... H01L 21/3105
                                                              438/4
2013/0078392 A1*  3/2013 Xiao ....................... C07F 7/025
                                                             427/579
2013/0295779 A1* 11/2013 Chandra ............... C23C 16/402
                                                             438/790

* cited by examiner

UV ASSISTED SILYLATION FOR POROUS LOW-K FILM SEALING

CROSS-REFERENCE TO RELATED APPLICATIONS

This application claims priority to U.S. Provisional Patent Application Ser. No. 62/027,149, filed on Jul. 21, 2014, which herein is incorporated by reference.

BACKGROUND

Field

Embodiments described herein relate to processes for processing low-k dielectric films. More specifically, embodiments described herein relate to processes for sealing porous low-k dielectric films.

Description of the Related Art

The dielectric constant (k) of dielectric films in semiconductor fabrication is continually decreasing as device scaling continues. Minimizing integration damage on low dielectric constant (low-k) films is important to be able to continue decreasing feature sizes. However, as feature sizes shrink, improvement in the resistive capacitance and reliability of dielectric films becomes a serious challenge.

Porous low-k dielectric films including for example, carbon-doped oxides (CDO), suffer significant damages after going through back end of line (BEOL) integration due to the contamination in the exposed pores, which leads to larger resistive-capacitive (RC) delay. In order to maintain the integrity of the porous low-k dielectric films and to minimize degradation of the dielectric constant of the porous low-k dielectric films, a method of mitigating damages to the porous low-k dielectric films is needed.

SUMMARY

Embodiments described herein provide a method for sealing a porous low-k dielectric film. The method includes forming a sealing layer on the porous low-k dielectric film using a cyclic process. The cyclic process includes repeating a sequence of depositing a sealing layer on the porous low-k dielectric film and treating the sealing layer until the sealing layer achieves a predetermined thickness. The treating of each intermediate sealing layer generates more reactive sites on the surface of each intermediate sealing layer, which improves the quality of the resulting sealing layer.

In one embodiment, a method for forming a sealing layer includes depositing an intermediate sealing layer on a porous low-k dielectric film using UV assisted UV photochemical vapor deposition, treating the intermediate sealing layer with UV energy or RF energy, and repeating the depositing and treating processes until a sealing layer having a predetermined thickness is formed.

In another embodiment, a method for forming a sealing layer includes delivering UV energy to a substrate disposed in a process chamber, wherein a porous low-k dielectric film is disposed on the substrate. The method further includes flowing a first precursor compound into the process chamber, and the first precursor compound contains a mono-function group. The method further includes flowing a second precursor compound into the process chamber, and the second precursor compound contains multi-function groups.

In another embodiment, a method for forming a sealing layer includes delivering UV energy to a substrate disposed in a process chamber, and a porous low-k dielectric film is disposed on the substrate. The method further includes flowing a first precursor compound into the process chamber, and the first precursor compound includes acetoxytrimethylsilane or dimethylaminotrimethylsilane. The method further includes flowing a second precursor compound into the process chamber, wherein the second precursor compound includes diacetoxydimethylsilane or bis(dimethylamino)dimethylsilane.

BRIEF DESCRIPTION OF THE DRAWINGS

So that the manner in which the above recited features of the disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

To facilitate understanding, identical reference numerals have been used, where possible, to designate identical elements that are common to the figures. It is contemplated that elements disclosed in one embodiment may be beneficially utilized on other embodiments without specific recitation.

DETAILED DESCRIPTION

Embodiments described herein provide a method for sealing a porous low-k dielectric film. The method includes forming a sealing layer on the porous low-k dielectric film using a cyclic process. The cyclic process includes repeating a sequence of depositing a sealing layer on the porous low-k dielectric film and treating the sealing layer until the sealing layer achieves a predetermined thickness. The treating of each intermediate sealing layer generates more reactive sites on the surface of each intermediate sealing layer, which improves the quality of the resulting sealing layer.

Figure 1:
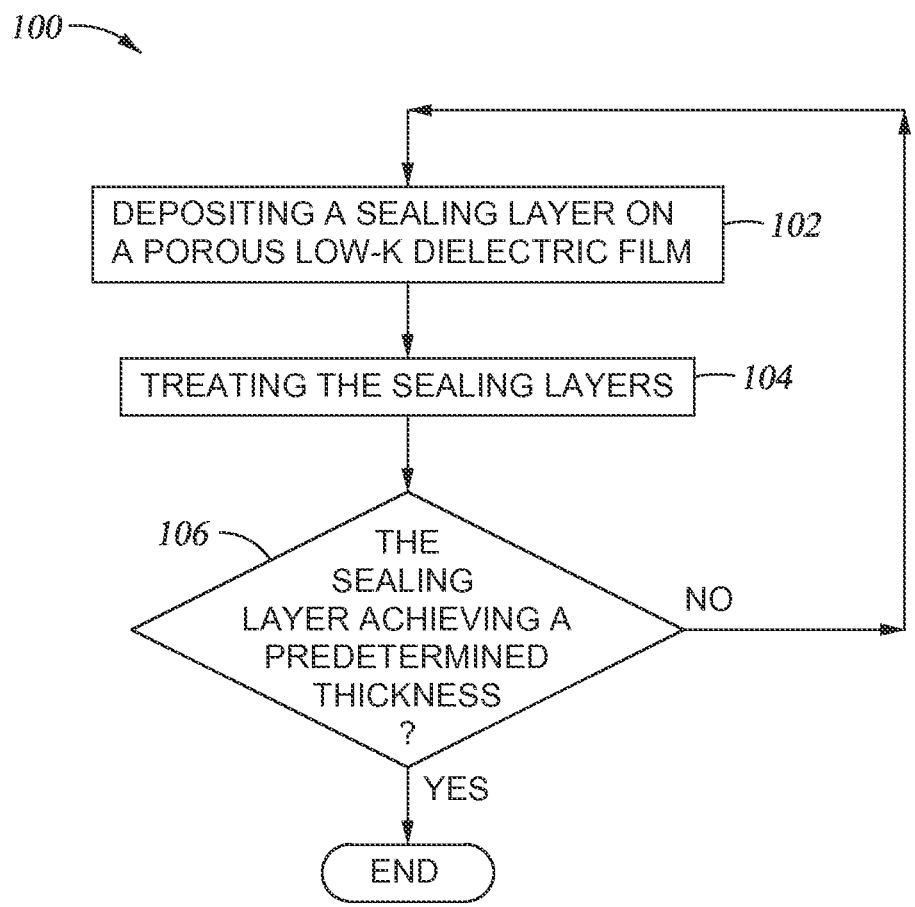
FIG. 1 is a process flow diagram illustrating one method of forming a sealing layer according to one embodiment described herein.

FIG. 1 is a process flow diagram 100 illustrating one method of forming a sealing layer according to one embodiment described herein. At block 102, a sealing layer is deposited on a porous low-k dielectric film. The porous low-k dielectric film may be any conventional porous, low-k, silicon based dielectric film having a k value below about 3. In one embodiment, the porous low-k dielectric film is an organosilicate glass (OSG, such as SiCOH) which is a silicon oxide that contains carbon and hydrogen atoms. The porous low-k dielectric film may have micro pores having diameters in the range of about 0.5 nm to about 20 nm. The sealing layer may be deposited on the porous low-k dielectric film using ultraviolet (UV) assisted photochemical vapor deposition.

The UV assisted photochemical vapor deposition may be performed in the chamber in which the porous low-k dielectric film is deposited, or in a different chamber. In one embodiment, the UV assisted photochemical vapor deposition is performed in an UV processing chamber. A substrate having a porous low-k dielectric film is placed in a processing chamber. The UV assisted photochemical vapor deposition process includes introducing a precursor compound and a carrier gas into the processing chamber and delivering UV energy to the porous low-k dielectric film disposed on the substrate by turning on one or more UV lamps. The precursor compound may be an silylation agent, such as tetravinylsilane, trivinylmethylsilane, trivinylsilane, divinyldimethylsilane, hexavinyldisiloxane, tetravinyldimethyldisiloxane, trivinylethoxysilane, trivinylmethoxysilane, diacetoxydimethylsilane, triacetoxymethylsilane, acetoxytrimethylsilane, methyldiethoxysilane, dimethyldiethoxysilane, dimethyldimethoxysilane, trimethyltrivinylcyclotrisiloxane, octamethylcyclotetrasiloxane, tris(dimethylamino)methylsilane, tetrakis(dimethylamino)silane, tris(dimethylamino)silane, bis(dimethylamino)dimethylsilane, bis(dimethylamino)methylvinylsilane, trisilylamine, dimethylaminotrimethylsilane, cyclotrisilazane, trimethyltrivinylcyclotrisilazane, hexamethylcyclotrisilazane, nonamethycyclotrisilazane, or other compounds containing Si, H and C. The carrier gas, such as He, Ar, $N_2$, and combinations thereof, may be used to assist the flow of the precursor compound into the processing chamber. In one embodiment, the substrate is a 300 mm substrate and the flow rate of the precursor compound may range from about 100 milligrams per minute (mgm) to about 2000 mgm and the flow rate of the carrier gas may range from about 500 standard cubic centimeters per minute (sccm) to about 5000 sccm.

The UV assisted photochemical vapor deposition process may be conducted at a processing chamber pressure between about 50 mTorr and 500 Torr and at a substrate temperature between about 50 degrees Celsius and about 400 degrees Celsius. The distance between the substrate and the showerhead ranges from about 400 millimeters (mm) to about 1400 mm. The processing time may be between about 15 seconds to about 900 seconds and the UV power may be at about 10 percent to about 100 percent. The sealing layer may have a thickness ranging from about 1 Angstrom to about 5 Angstroms.

At block 104, the sealing layer is treated so more reactive sites are generated on the surface of the sealing layer. The treatment process may be an UV assisted treatment process or an RF assisted treatment process. The treatment process may be performed in the chamber in which the sealing layer is deposited, or in a different chamber. In one embodiment, the treatment process is performed in a load lock chamber that is in the same mainframe as the processing chamber in which the sealing layer is deposited. The UV assisted treatment process may include flowing a reactive gas into a chamber in which the substrate having a porous low-k dielectric film and a sealing layer disposed thereon is disposed therein. UV energy is directed to the sealing layer by turning on one or more UV lamps. The chamber pressure may range from about 6 Torr to about 200 Torr and the UV power may range from about 40 percent to about 100 percent. The reactive gas may have a flow rate ranging from about 20 sccm to about 2000 sccm. Example of the reactive gas includes $NH_3$, $H_2$, $O_2$, $N_2O$, $CO_2$, or combinations thereof. Insert gas such as Ar or He may be also introduced into the chamber at a flow rate ranging from about 20 sccm to about 2000 sccm. The processing time may range from about 10 seconds to about 600 seconds.

The RF assisted treatment process may include flowing a reactive gas into a chamber in which the substrate having a porous low-k dielectric film and a sealing layer disposed thereon is disposed therein. The chamber pressure may range from about 2 Torr to about 20 Torr and the RF power may range from about 20 W to about 300 W. The reactive gas may have a flow rate ranging from about 20 sccm to about 2000 sccm. Example of the reactive gas includes $NH_3$, $H_2$, $O_2$, $N_2O$, $CO_2$, or combinations thereof. Insert gas such as Ar or He may be also introduced into the chamber at a flow rate ranging from about 20 sccm to about 2000 sccm. The processing time may range from about 1 second to about 600 seconds.

The UV assisted treatment process in a load lock chamber may include flowing a reactive gas into a load lock chamber in which the substrate having a porous low-k dielectric film and a sealing layer disposed thereon is disposed therein. UV energy is directed to the sealing layer by turning on one or more UV lamps. The load lock chamber pressure may range from about 0.07 Torr to about 20 Torr and the UV power may range from about 40 percent to about 100 percent. The reactive gas may have a flow rate ranging from about 20 sccm to about 2000 sccm. Example of the reactive gas includes $NH_3$, $H_2$, $O_2$, $N_2O$, $CO_2$, or combinations thereof. Insert gas such as Ar or He may be also introduced into the chamber at a flow rate ranging from about 20 sccm to about 2000 sccm. The processing time may range from about 10 seconds to about 600 seconds.

The treatment process may be performed in the same chamber as the UV assisted deposition process. In one embodiment, a processing chamber is capable to perform both the UV assisted deposition process and the RF assisted treatment process. The treatment process of the sealing layer generates more reactive sites on the surface of the sealing layer, leading to an improved film quality as subsequent sealing layer is deposited on the treated sealing layer. The depositing of a sealing layer and the treating of the sealing layer may be repeated until the resulting sealing layer achieves a predetermined thickness. In one embodiment, the predetermined thickness ranges from about 5 Angstroms to about 200 Angstroms. The thickness of the resulting sealing layer may depend on the application. If one deposition process and one treatment process are considered a cycle, the number of cycles ranges from about 2 to 100.

As shown in FIG. 1, at block 106, if the sealing layer has not reached the predetermined thickness, blocks 102 and 104 are repeated. Each time an intermediate sealing layer is deposited on the previously deposited and treated sealing layer, the surface of the intermediate sealing layer is treated for the next sealing layer to be deposited thereon. If the resulting sealing layer has reached the predetermined thickness, the subsequent treating process may not be performed. The number of cycles may depend on the predetermined thickness of the resulting sealing layer. By using the cyclic process, a sealing layer is conformally deposited on the porous low-k dielectric film and can effectively reduce the porosity of the porous low-k dielectric film at the surface of the porous low-k dielectric film. In one embodiment, the porosity at the surface is reduced to 4 percent from 33 percent after 8 cycles, showing that the resulting sealing layer is a very effective pore seal.

UV energy can dissociate most Si—C—O or Si—N bonds in precursor compounds, such as silylation agents, to form carbon doped silicon oxides or nitrides. Depending on the silylation agent used, the UV assisted silylation may consist of substantial amount of carbon, leading to fairly low-k value. Thus, the deposited film as the result of the silylation process can be very conformal and dense because the process is mostly thermally driven on the substrate surface. The silylation agent used as the precursor compound may include mono-function group or multi-function group. A silylation agent having a mono-function group only has a single functional group attached to the silicon molecule, such as acetoxytrimethylsilane or dimethylaminotrimethylsilane. A silylation agent having multi-function group has multiple functional groups attached to the silicon molecule, such as diacetoxydimethylsilane or bis(dimethylamino)dimethylsilane. In one embodiment, the sealing layer may be formed by a two-step process. The first step is flowing a silylation agent containing mono-function group into a process chamber in which a substrate having a porous low-k dielectric film disposed thereon is disposed therein. One or more UV lamps are turned on to direct UV energy to the porous low-k dielectric film. The silylation agent containing mono-function group and the UV energy provides k value recovery on the porous low-k dielectric film. Prior to flowing the silylation agent containing mono-function group into the process chamber, the process chamber may have a predetermined chamber pressure by flowing a carrier gas into the process chamber.

The second step is flowing a silylation agent containing multi-function groups in to the process chamber. The one or more UV lamps are still turned on. The silylation agent containing multi-function groups not only can react with the porous low-k dielectric film, but also react with itself to form a network like film on the porous low-k dielectric film. The network like film is the sealing layer. The sealing layer may have a thickness from about 5 Angstroms to about 200 Angstroms. An optional transition step may be performed between the first and second steps depending on the film surface property.

Alternatively to the two-step process, the sealing layer may be formed by flowing a silylation agent containing mono-function group and a silylation agent containing multi-function groups into the process chamber at the same time while the one or more UV lamps are turned on. In another embodiment, only a silylation agent containing multi-function groups is flowed into the process chamber while the one or more UV lamps are turned on. A UV curing process may be performed after the sealing layer is formed on the porous low-k dielectric film. The UV curing process can remove hydroxyl groups not reacted with silylation agent containing multi-function groups, which lowers the k value. In addition, UV curing process helps maintain the surface of the sealing layer to be hydrophobic.

Figure 2:
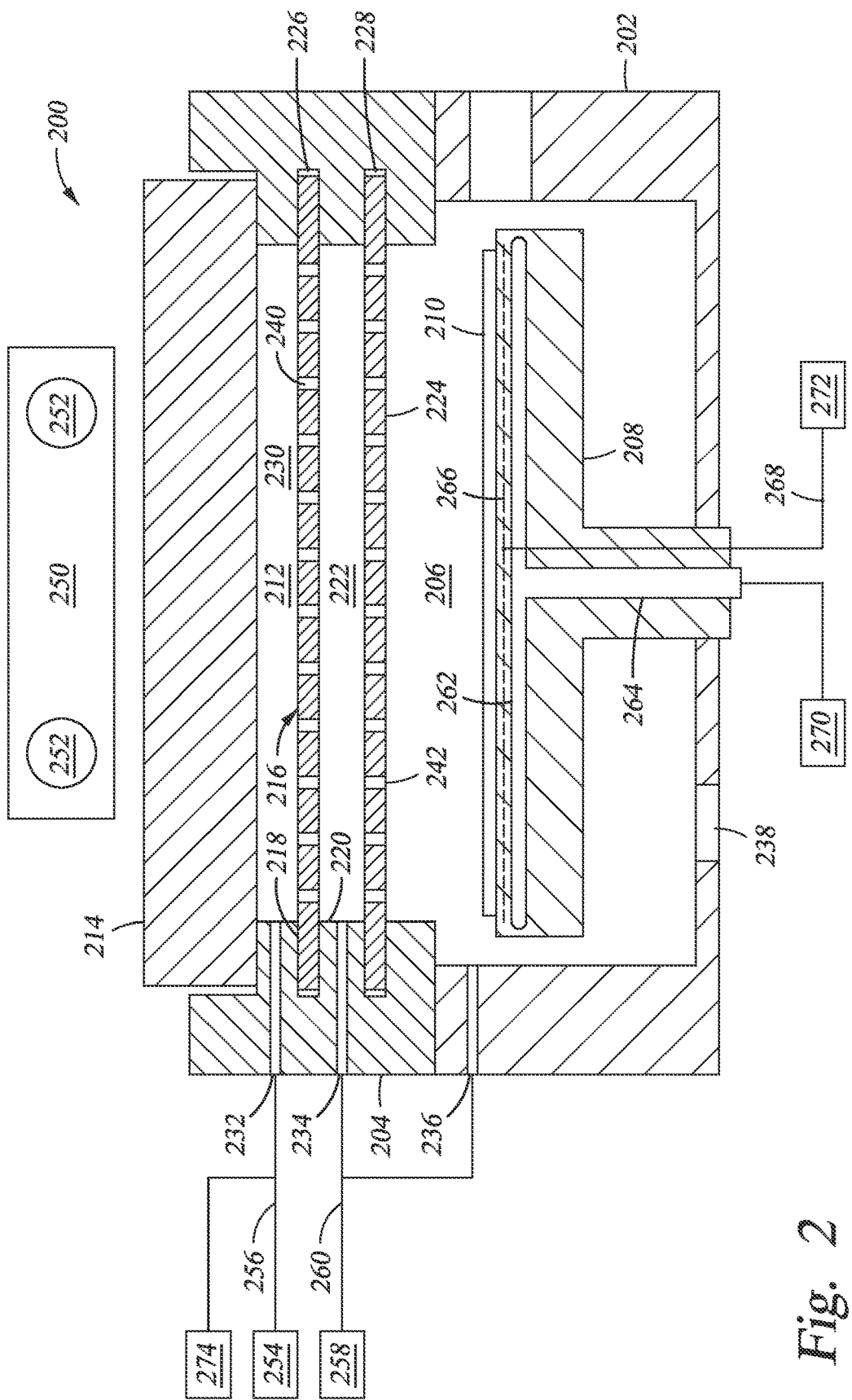
FIG. 2 is a schematic cross sectional view of an apparatus according to one embodiment described herein.

The methods described herein may be performed using the ONYX™ processing chamber available from Applied Materials, Inc., of Santa Clara, Calif. Formation of a sealing layer by repeating the processes of depositing a sealing layer and treating the sealing layer may also be performed using an apparatus such as that shown in FIG. 2. The apparatus of FIG. 2 is a vapor deposition apparatus 200 that includes UV radiation for activating a precursor compound. The apparatus 200 includes a chamber body 202 and a chamber lid 204 disposed over the chamber body. The chamber body 202 and the chamber lid 204 form an inner volume 206. A substrate support assembly 208 is disposed in the inner volume 206. The substrate support assembly 208 receives and supports a substrate 210 thereon for processing.

A first UV transparent gas distribution showerhead 216 is hung in the inner volume 206 through a central opening 212 of the chamber lid 204 by an upper clamping member 218 and a lower clamping member 220. The UV transparent gas distribution showerhead 216 is positioned facing the substrate support assembly 208 to distribute one or more processing gases across a distribution volume 222 which is below the first UV transparent gas distribution showerhead 216. A second UV transparent showerhead 224 is hung in the inner volume 206 through the central opening 212 of the chamber lid 204 below the first UV transparent gas distribution showerhead 216. Each of the UV transparent gas distribution showerheads 216 and 224 is disposed in a recess formed in the chamber lid 204. A first recess 226 is an annular recess around an internal surface of the chamber lid 204, and the first UV transparent gas distribution showerhead 216 fits into the first recess 226. Likewise, a second recess 228 receives the second UV transparent gas distribution showerhead 224.

A UV transparent window 214 is disposed above the first UV transparent gas distribution showerhead 216. The UV transparent window 214 is positioned above the first UV transparent gas distribution showerhead 216 forming a gas volume 230 between the UV transparent window 214 and the first UV transparent gas distribution showerhead 216. The UV transparent window 214 may be secured to the chamber lid 204 by any convenient means, such as clamps, screws, or bolts.

The UV transparent window 214 and the first and second UV transparent gas distribution showerheads 216 and 224 are at least partially transparent to thermal or radiant energy within the UV wavelengths. The UV transparent window 214 may be quartz or another UV transparent silicon material, such as sapphire, $CaF_2$, $MgF_2$, AlON, a silicon oxide or silicon oxynitride material, or another transparent material.

A UV source 250 is disposed above the UV transparent window 214. The UV source 250 is configured to generate UV energy and project the UV energy towards the substrate support assembly 208 through the UV transparent window 214, the first UV transparent gas distribution showerhead 216, and the second UV transparent gas distribution showerhead 224. A cover (not shown) may be disposed above the UV source 250. In one embodiment, the cover may be shaped to assist projection of the UV energy from the UV source 250 towards the substrate support.

In one embodiment, the UV source 250 includes one or more UV lights 252 to generate UV radiation. The UV lights 252 may be lamps, LED emitters, or other UV emitters. The UV sources may be argon lamps discharging radiation at 126 nm, krypton lamps discharging at 146 nm, xenon lamps discharging at 172 nm, krypton chloride lamps discharging at 222 nm, xenon chloride lamps discharging at 308 nm, mercury lamps discharging at 254 nm or 365 nm, metal vapor lamps such as zinc, which discharges at 214 nm, rare earth near-UV lamps such as europium-doped strontium borate or fluoroborate lamps discharging at 368-371 nm, to name a few examples.

The apparatus 200 includes flow channels configured to supply one or more processing gases and precursor compounds across the substrate support assembly 208 to process a substrate disposed thereon. A first flow channel 232 provides a flow pathway for gas to enter the gas volume 230 and to be exposed to UV radiation from the UV source 250. The gas from the gas volume 230 may flow through the first UV transparent gas distribution showerhead 216 into the distribution volume 222. A second flow channel 234 provides a flow pathway for precursor compounds and gases to enter the distribution volume 222 directly without passing through the first UV transparent gas distribution showerhead 216 to mix with the gas that was previously exposed to UV radiation in the gas volume 230. The mixed gases in the distribution volume 222 are further exposed to UV radiation through the first UV transparent gas distribution showerhead 216 before flowing through the second UV transparent gas distribution showerhead 224 into a space proximate the substrate support assembly 208. The gas proximate the substrate support assembly 208, and a substrate disposed on the substrate support assembly 208, is further exposed to the UV radiation through the second UV transparent gas distribution showerhead 224. Gases may be exhausted through the opening 238. Purge gases may be provided through the opening 238 in the bottom of the chamber, such that the purge gases flow around the substrate support assembly 208, effectively preventing intrusion of process gases into the space under the substrate support.

The first UV transparent gas distribution showerhead 216 includes a plurality of through holes 240 that allow processing gas to flow from the gas volume 230 to the distribution volume 222. The second UV transparent gas distribution showerhead 224 also includes a plurality of through holes 242 that allow processing gas to flow from the distribution volume 222 into the processing space proximate the substrate support assembly 208. The through holes in the first and second gas UV transparent gas distribution showerheads may be evenly distributed with the same spacing or different spacing.

A purge gas or carrier gas source 254 may be coupled to the first flow channel 232 through a conduit 256. Purge gas from the purge gas source 254 may be provided through the first flow channel 232 during substrate processing to prevent intrusion of process gases into the gas volume 230. A cleaning gas source 274 may also be coupled to the first flow channel 232 through the conduit 256 to provide cleaning of the conduit 256, the first flow channel 232, the gas volume 230, and the rest of the chamber 202 when not processing substrates.

A process gas or precursor compound source 258 may be coupled to the second flow channel 234 through a conduit 260 to provide a mixture, as described above, to the chamber body 202. The process gas source 258 may also be coupled to a third flow channel 236. Appropriate valves may allow selection of one or both of the flow channels 234, 236 for flowing the process gas mixture into the chamber body 202.

Substrate temperature may be controlled by providing heating and cooling features in the substrate support assembly 208. A coolant conduit 264 may be coupled to a coolant source 270 to provide a coolant to a cooling plenum 262 disposed in the substrate support assembly 208. One example of a coolant that may be used is a mixture of 50% ethylene glycol in water, by volume. The coolant flow is controlled to maintain temperature of the substrate at or below a desired level to promote deposition of UV-activated oligomers or fragments on the substrate. A heating element 266 may also be provided in the substrate support assembly 208. The heating element 266 may be a resistive heater, and may be coupled to a heating source 272, such as a power supply, by a conduit 268. The heating element 266 may be used to heat the substrate during the hardening process described above.

While the foregoing is directed to embodiments of the present invention, other and further embodiments of the invention may be devised without departing from the basic scope thereof, and the scope thereof is determined by the claims that follow.

The invention claimed is:

1. A method for forming a sealing layer, comprising:
   delivering UV energy to a substrate disposed in a process chamber, wherein a porous low-k dielectric film is disposed on the substrate;
   forming an intermediate sealing layer, wherein forming the intermediate sealing layer sequentially comprises:
      flowing a first precursor compound into the process chamber while delivering UV energy to the porous low-k dielectric film disposed on the substrate, wherein the first precursor compound comprises acetoxytrimethylsilane or dimethylaminotrimethylsilane;
      stopping the flow of the first precursor compound;
      flowing a second precursor compound into the process chamber while delivering UV energy to the porous low-k dielectric film disposed on the substrate, wherein the second precursor compound comprises diacetoxydimethylsilane or bis(dimethylamino)dimethylsilane; and
      exposing the substrate to UV energy after flowing the second precursor compound to cure the intermediate sealing layer; and
   repeating the forming of the intermediate sealing layer to form additional intermediate sealing layers.

2. The method of claim 1, wherein the sealing layer has a thickness from about 5 Angstroms to about 200 Angstroms.

* * * * *